United States Patent [19]
Bauer et al.

[11] Patent Number: 5,485,422
[45] Date of Patent: Jan. 16, 1996

[54] DRAIN BIAS MULTIPLEXING FOR MULTIPLE BIT FLASH CELL

[75] Inventors: Mark E. Bauer, Cameron Park; Kevin W. Frary, Fair Oaks; Sanjay S. Talreja, Folsom, all of Calif.

[73] Assignee: Intel Corporation, Santa Clara, Calif.

[21] Appl. No.: 252,684

[22] Filed: Jun. 2, 1994

[51] Int. Cl.$^6$ .................................................. G11C 11/34
[52] U.S. Cl. ...................... 365/168; 365/168; 365/189.07
[58] Field of Search .................................... 365/168, 184, 365/185, 900, 189.07, 205, 207

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 5,012,448 | 4/1991 | Matsuoka et al. | 365/208 |
| 5,043,940 | 8/1991 | Harari | 365/168 |
| 5,163,021 | 11/1992 | Mehrotra | 365/185 |
| 5,172,338 | 12/1992 | Mehrotra | 365/185 |
| 5,297,148 | 3/1994 | Harari | 371/10.2 |
| 5,351,210 | 9/1994 | Saito | 365/189 |

Primary Examiner—A. Zarahian
Attorney, Agent, or Firm—Blakely, Sokoloff, Taylor & Zafman

[57] ABSTRACT

A memory device is disclosed which includes memory cells having m possible states, where m is at least 2. The memory device includes a multiplexed pair of output paths, wherein each output path is coupled to sense the state of a memory cell and includes a read path circuit, a column load circuit, and a comparator. Provided between the pair of output paths is a switching circuit for coupling the comparators to one another in response to a control signal. For single-bit read operations, each output path senses and outputs the data of the associated memory cell, and the control signal is inactive. When the control signal is active, the read path circuit and column load circuit of one of the output paths is disabled and the switching circuit couples the other read path circuit to the second comparator such that the state of the memory cell is sensed by two comparators.

43 Claims, 8 Drawing Sheets

DRAIN BIAS MULTIPLEXING FOR MULTIPLE BIT FLASH CELL

FIELD OF THE INVENTION

The invention relates generally to non-volatile memory devices and more particularly to non-volatile memory devices capable of switching on the fly between single-bit per cell and multiple-bit per cell read modes.

BACKGROUND OF THE INVENTION

The most commonly used nonvolatile memory devices typically include a multiplicity of memory cells that are each capable of storing only a single binary bit of data. When a memory cell is read, the single bit of data indicates which of two possible analog states the memory cell is in. The memory cell is either "programmed" or "erased." For some prior devices, such as the flash electrically erasable programmable read only memory ("flash EEPROM"), the state of the memory cell is varied by storing charge on an electrically isolated floating gate.

Nonvolatile memory devices that store multiple bits of binary data per memory cell are known to the prior art. For example, U.S. Pat. No. 4,415,992 describes a flash EEPROM having flash cells that each store multiple bits of binary data. Each bit of binary data corresponds to two analog states. The use of a floating gate for storing data in a flash memory cell is fundamentally the same for both the single-bit and multiple-bit flash memory cells.

Although multiple-bit memory devices are advantageous, it is desirable to have a multiple-bit per cell memory device that is capable of switching between multiple-bit and single-bit read modes. At the system level, single-bit per cell data is much more reliably determined than multiple-bit per cell data, which may require error detection and correction processing to achieve a reasonable level of reliability. Some data structures are not large enough to justify the overhead of error detection and correction data, and storage of such data structures is preferably done in a single-bit per cell write mode. Further, single-bit write and read operations are typically performed at higher speeds, and some applications may need to take advantage of the increased speed.

At the device level, there are some operations that may be performed in bulk on large portions of the memory array. Typically, these bulk operations do not require an accurate sensing of the precise state of each memory cell of the memory array. Instead, it is sufficient to discriminate between two voltage levels, which may be done using a single comparator, as is done during single-bit read operations.

SUMMARY AND OBJECTS OF THE INVENTION

Therefore, it is one object of the invention to provide an apparatus for switching between multiple-bit and single-bit read modes in a memory device having an array of memory cells that each may store more than one binary bit of data.

It is another object of the invention to provide an apparatus that allows for switching on the fly between the multiple-bit and single-bit read modes.

These and other objects of the invention are provided by a memory device that includes a first memory cell coupled to a first read path circuit and a second memory cell coupled to a second read path circuit. The first read path circuit is coupled to a first negative terminal of a first comparator, and the second read path circuit is coupled to a second negative terminal of a second comparator. A switching circuit is provided which is coupled to the first and second terminals and is coupled to receive a control signal. When the control signal is active, the switching circuit couples the first negative terminal to the second negative terminal and disables the second read path circuit such that the first and second negative terminals are both coupled to the first read path circuit.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A memory device is disclosed which includes memory cells having m possible states, where m is at least 2. The memory device includes a multiplexed pair of output paths, wherein each output path is coupled to sense the state of a memory cell. Each output path includes a read path circuit and a comparator. Provided between the pair of output paths is a switching circuit for coupling the comparators to one another in response to a control signal. For single-bit read operations, each output path senses and outputs the data of an associated memory cell, and the control signal is inactive. When the control signal is active, the read path circuit and column load circuit of one of the output paths is disabled and the switching circuit couples the other read path circuit to the second comparator such that the state of the memory cell is sensed by two comparators.

For the purposes of illustration, the memory device discussed in relation to the FIGURES is assumed to be a sixteen output flash EEPROM having a 512 k flash cell array. The flash cell array is arranged in 1024 rows (or "wordlines") and 512 columns (or "bitlines"), which are subdivided into sixteen data blocks of equal size having 1024 rows and 32 columns each. Components that are common to each embodiment are labeled similarly to avoid confusion. This example is not exhaustive of the memory devices in which the method and apparatus of the present invention can be implemented. For example, the disclosed apparatus may be used with erasable programmable read only memory (EPROM) and dynamic random access memory (DRAM) technologies.

Each flash cell of the exemplary flash array is comprised of a single field effect transistor ("FET") including a select gate, a floating gate, a source, and a drain. For read operations, each flash cell has its select gate coupled to a wordline, its source coupled to system ground, and its drain coupled to a bitline. Information is stored in the flash cell by altering the amount of charge on the floating gate, which causes the threshold voltage $V_t$ of the flash cell to be varied. During programming, charge is placed on the floating gate such that the threshold voltage $V_t$ of a flash cell is set to a voltage that falls within one of four ranges of $V_t$ voltages that each defines a known analog state. Thus, each flash cell has four possible analog states. To assist in the determination of the state of a flash cell, a separation range is provided between contiguous analog states. Preferably, no flash cell is programmed to have its $V_t$ fall within a separation range.

For read operations, the number of analog states is "variable" between two states for single-bit read operations and four states for multiple-bit read operations. The "variance" of the number of states between single-bit and multiple-bit read operations is conceptual as the $V_t$ of a flash cell is programmed to be in one of four analog states regardless of the read mode. For a single-bit read operation, the digital data stored in a flash cell is determined by comparing the $V_t$ of the flash cell to a single reference flash cell that has its $V_t$ set to a voltage in a separation range. If the $V_t$ of the flash cell is greater than the $V_t$ of the reference cell, a logic 0 is read. If the $V_t$ of the flash cell is less than the $V_t$ of the reference cell, a logic 1 is read. Thus, only a single binary bit is output, and the number of possible analog states for the flash cell is "reduced" to two. For a multiple-bit read operation, the number of comparisons is increased such that two binary bits are output, indicating one of four possible states.

Figure 1:
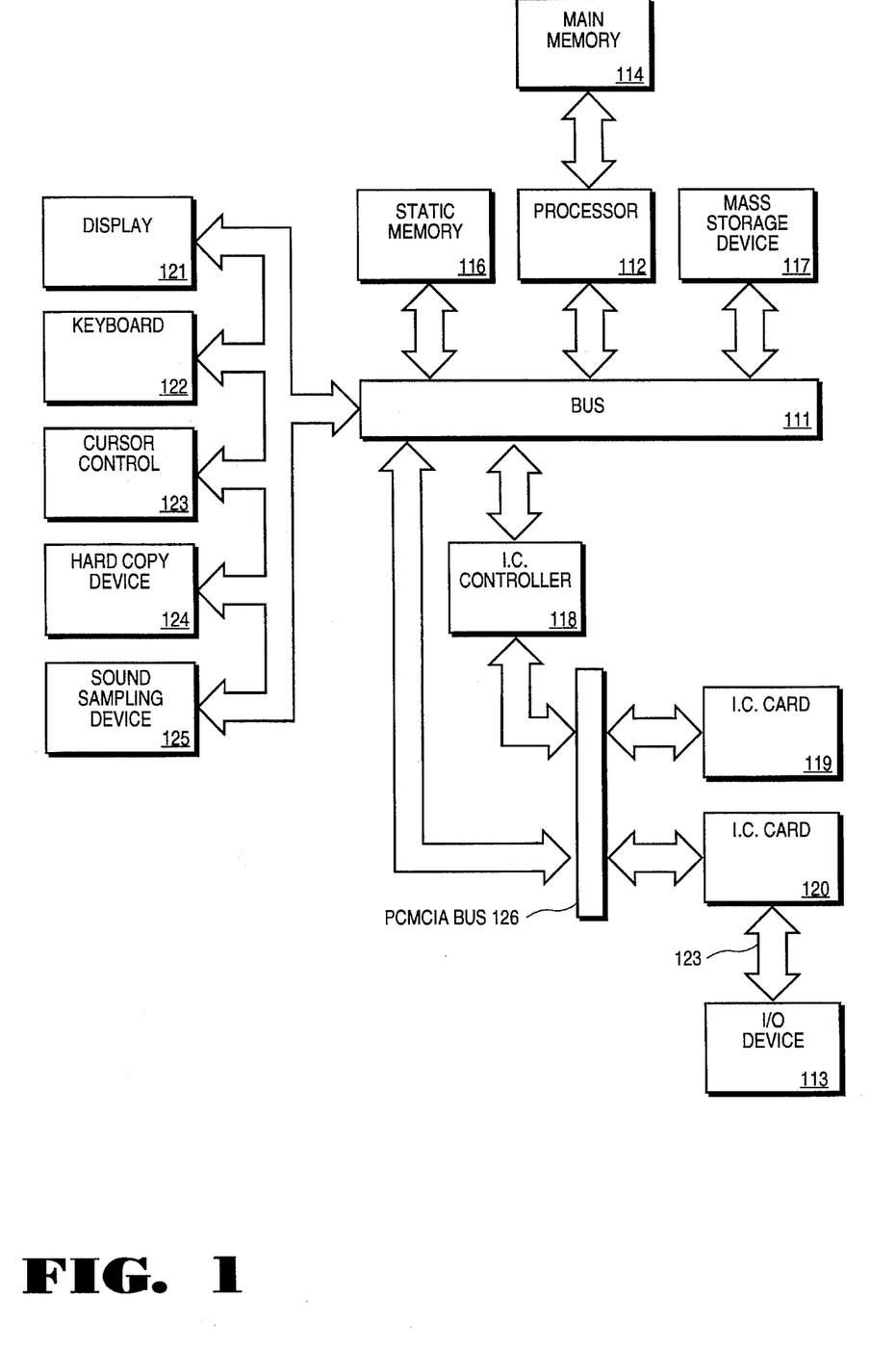
FIG. 1 shows a computer system of one embodiment.

FIG. 1 shows a computer system of one embodiment. The computer system generally includes a bus 111, to which may be coupled a processor 112, main memory 114, static memory 116, mass storage device 117, and integrated circuit controller 118. Static memory 116 may include a flash electrically eraseable programmable read only memory ("flash EEPROM") or other nonvolatile memory device that stores multiple bits of data per cell. Similarly, mass storage device 117 maybe a solid state hard drive 117 using multiple bit per cell nonvolatile memory devices for storing data. The solid state hard drive 117 emulates standard IDE hardware and BIOS-equipped systems and uses an industry standard AT-Attachment Interface for Disk Drives (ATA) command such that no software drivers are required. In this manner, the solid state hard drive 117 appears as a magnetic hard disk drive to the computer system, but the solid state disk drive 117 has reduced thickness and weight compared to typical magnetic hard disk drives which makes the solid state disk drive especially useful for mobile computers.

Integrated circuit cards 119 and 120 may be included in the computer system and are coupled to a Personal Computer Memory Card Industry (PCMCIA) bus 126. PCMCIA bus 126 is coupled to bus 111 and to integrated circuit (IC) controller 118 for providing communication information between cards 119 and 120 and the remainder of the computer system. IC controller 118 provides control and address information to IC cards 119 and 120 via PCMCIA bus 126 and is coupled to bus 111.

The computer system may further include a display device 121, a keyboard 122, a cursor control device 123, a hard copy device, and a sound sampling device 125. The specific components and configuration of the computer system is determined by the particular applications for which the computer system is to be used. For example, the computer system of FIG. 1 may be a personal digital assistant (PDA), a pen-based computer system, a mainframe computer, or a personal computer.

Figure 2:
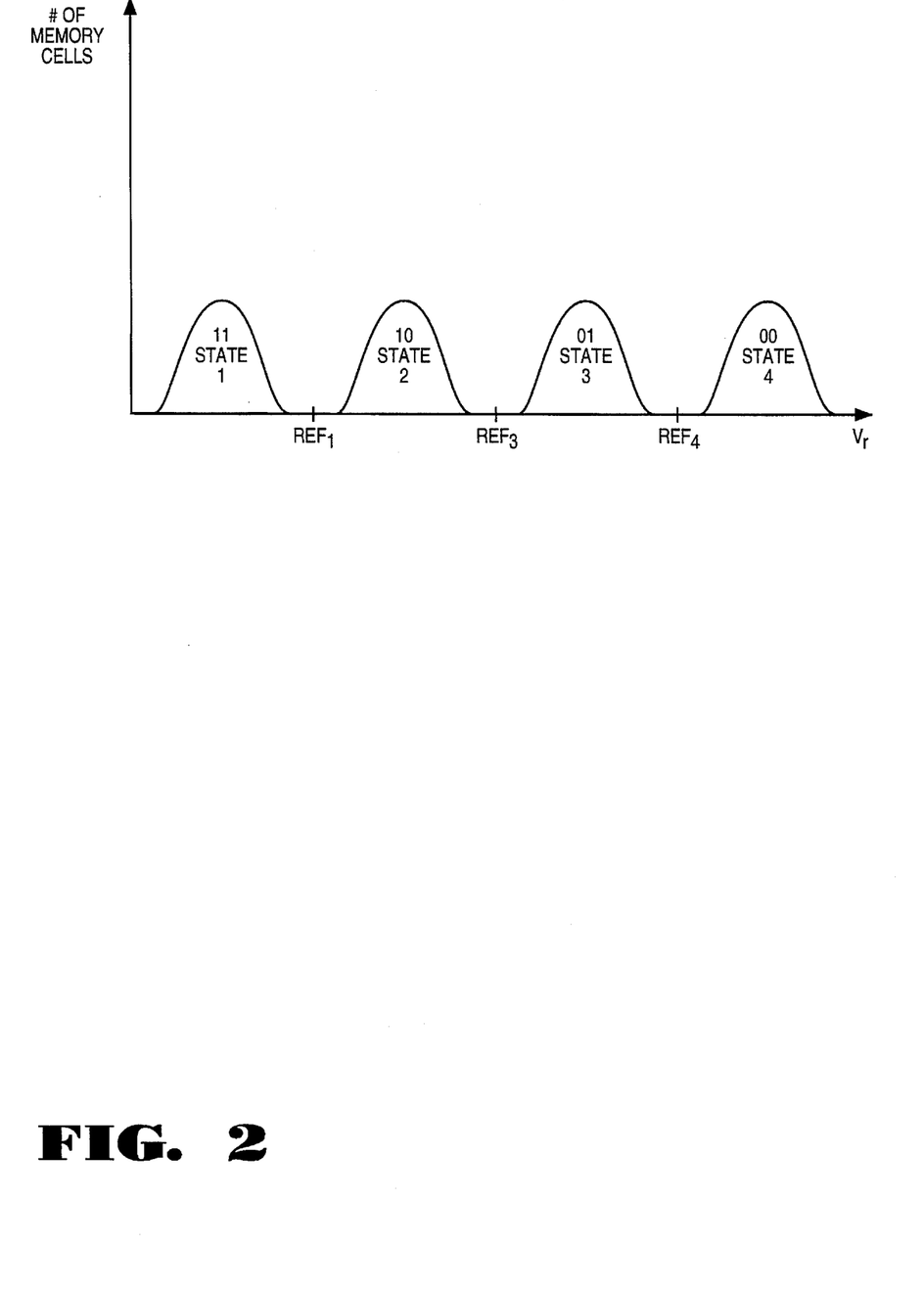
FIG. 2 shows a flash cell distribution as a function of $V_t$ for a prior art flash device.

For each embodiment, each memory cell is a flash cell. Each flash cell in the array is capable of being in one of four analog states, and the state of the flash cell is indicated by two binary bits. FIG. 2 shows a distribution of multi-level flash cells as a function of threshold voltage $V_t$. As can be seen, each state is separated by a separation range, and three references, $Ref_1$, $Ref_2$ and $Ref_3$, are provided, one each from the three separation ranges. The references are provided to distinguish between the analog states. State 1 encompasses the lowest range of $V_t$ voltages of the four states and is indicated by both bits being logic 1's (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0's (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic O's.

It should be noted that nonvolatile memory devices other than flash EEPROM's and volatile memory devices such as Dynamic Random Access Memories (DRAM) are potentially capable of storing three or more analog states. Further, it should be noted hat the analog states of nonvolatile devices having a floating gate may be expressed in terms other than the threshold voltage $V_t$. For example, analog states may be expressed as ranges of threshold voltages $V_t$ as shown in FIG. 2, as ranges of drain currents $I_D$, or as ranges of charge stored on the floating gate. Volatile memory cells such as DRAM memory cells are typically comprised of a capacitor and may similarly be expressed as ranges of charge, currents or voltages.

A nonvolatile memory cell that has a floating gate behaves as a field effect transistor having a threshold voltage Vt that increases as charge is added to the floating gate. The memory cell drain current $I_D$ ("cell current") decreases as the threshold voltage Vt and cell charge level increase. The memory cell threshold voltage $V_t$ is related to the memory cell drain current $I_D$ by the expression:

$$I_D \alpha G_{mx}(V_G - V_t) \text{ for } V_D > V_G - V_t$$

$G_m$ is the transconductance of the memory cell;

$V_G$ is the memory cell gate voltage;

$V_D$ is the memory cell drain voltage; and $V_t$ is the memory cell threshold voltage.

Given this relationship, there are a number of ways to sense the amount of charge stored on of the floating gate of the memory cell, including: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$ that is typically between defined states. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be provided by using voltage supplies or current sources to supply voltages or currents that correspond to reference memory cells having a cell charge level between defined analog states. For this reason, the references $Ref_1$, $Ref_2$, and $Ref_3$ are not specified as being threshold voltages, cell currents, or levels of charge stored on a floating gate. Instead, it is to be understood that the references shown in FIG. 2 correspond to the characteristics of the memory cell as defined by the relationship between cell charge level, cell current $I_D$, and threshold voltage $V_t$. For the purposes of simplifying the remaining discussion, the references $Ref_1$, $Ref_2$, and $Ref_3$ will expressed as threshold voltages $V_{R1}$, $V_{R2}$ and $V_{R3}$, respectively.

Figure 3A:
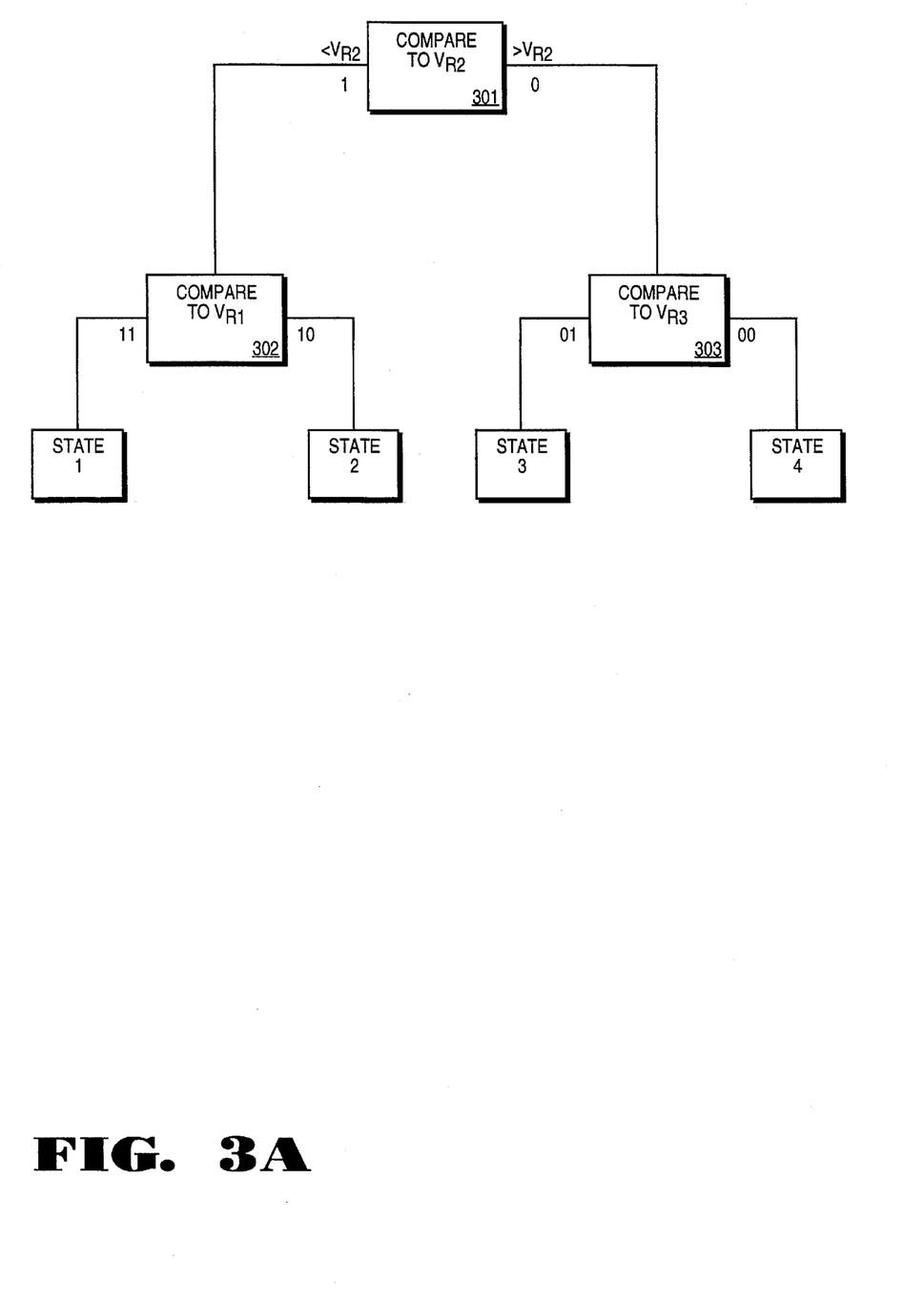
FIG. 3A is a flow chart illustrating a binary search method for multiple-bit read operations.
Figure 3B:
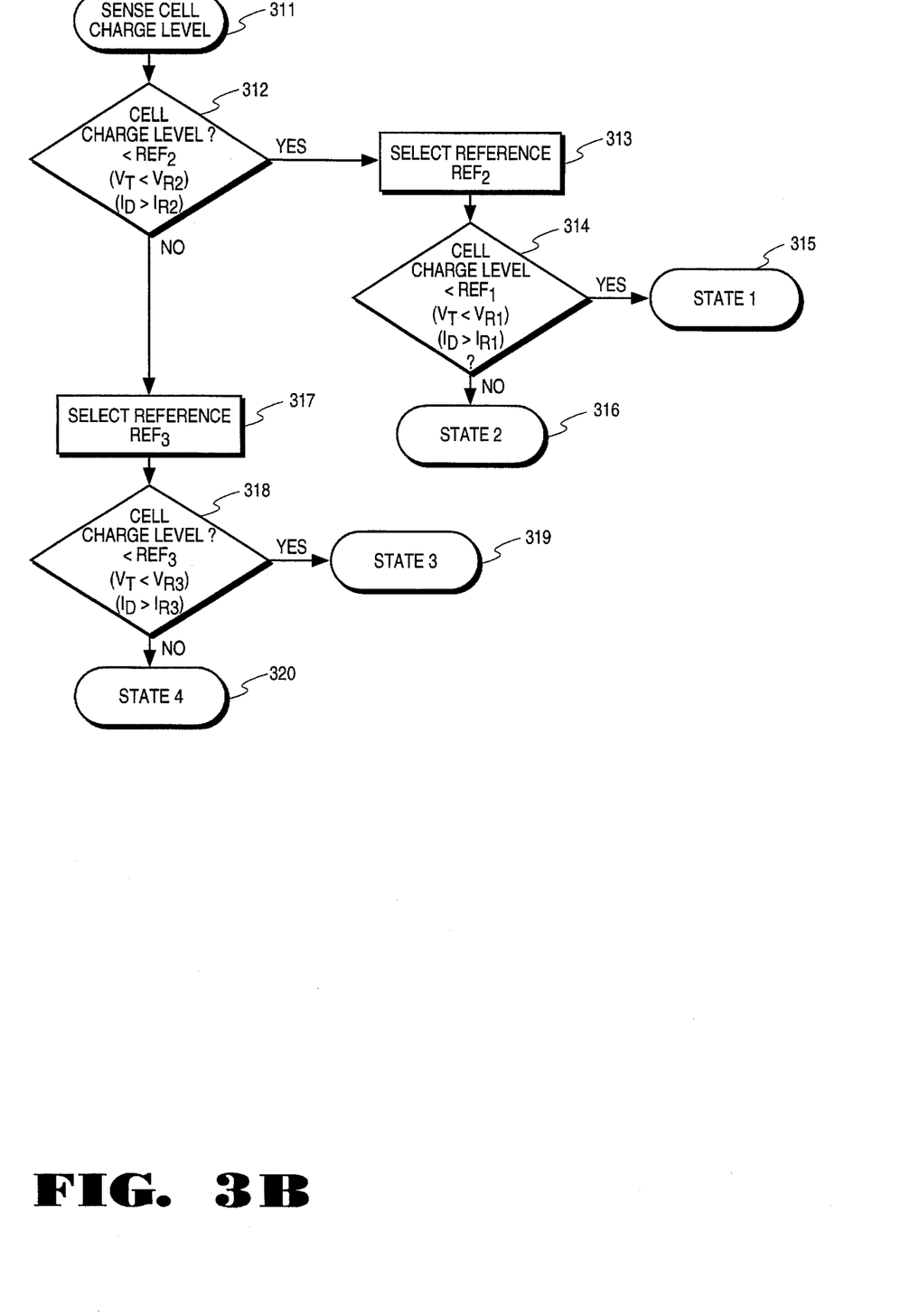
FIG. 3B is a more conventional flow chart of the binary search method for multiple-bit read operations.

For multiple-bit read operations, one method for reading is shown in FIGS. 3A and 3B. FIG. 3A is a block diagram showing a binary search method for multiple bit read operations of a memory cell having three or more states. In step 301, the cell charge level of the selected cell is sensed and compared to a first reference flash cell having its $V_t$ equal to $V_{R2}$. Depending on the result of the initial comparison, the sensed cell charge level of the selected cell is compared to a selected one of a second reference flash cell having its $V_t$ equal to $V_{R1}$ and a third reference flash cell having its $V_t$ equal to $V_{R3}$. If the sensed cell charge level of the selected flash is less than that of the first reference flash cell, the sensed cell charge level is compared to the second reference flash cell at step 2, and the selected flash cell is either in state 1 or state 302. If the sensed cell charge level of the selected flash is greater than that of the first reference flash cell, the sensed cell charge level is compared to the third reference flash cell at step 303, and the selected flash cell is either in state 3 or state 4. Sensing of the cell charge level may be done according to any of the methods previously discussed.

FIG. 3B is a conventional flow chart showing the binary search method. At step 311, the cell charge level of the memory cell is sensed. At step 312, it is determined whether the cell charge of the memory cell is less than the cell charge level of the reference $Ref_2$. If the cell charge level of the memory cell is less than the cell charge level of the reference $Ref_2$, the threshold voltage $V_t$ of the memory cell is less than that of a reference memory cell having a $V_t$ equal to $V_{R2}$. Similarly, the cell current $I_D$ of the memory cell is greater than the cell current $I_{R2}$ of a reference memory cell having a cell current of $I_{R2}$. If the cell charge level of the memory cell is less than the cell charge level of reference $Ref_2$, $Ref_1$ is selected at step 313. At step 314, it is determined whether the cell charge of the memory cell is less than the cell charge level of the reference $Ref_1$. If the cell charge level of the memory cell is less than the cell charge level of the reference $Ref_1$, the memory cell is indicated as being in state 1 at step 315. If the cell charge level of the memory cell is greater than the cell charge level of the reference $Ref_1$, the memory cell is indicated as being in state 2 at step 316.

If the cell charge level of the memory cell is less than the cell charge level of reference $Ref_2$, $Ref_3$ is selected at step 317. At step 318, it is determined whether the cell charge of the memory cell is less than the cell charge level of the reference $Ref_3$. If the cell charge level of the memory cell is less than the cell charge level of the reference $Ref_3$, the memory cell is indicated as being in state 3 at step 319. If the cell charge level of the memory cell is greater than the cell charge level of the reference $Ref_3$, the memory cell is indicated as being in state 4 at step 320.

For single-bit read operations, a single comparison is made between a selected flash cell and a reference flash cell having its $V_T$ equal to $V_{R2}$. If the selected flash cell is programmed to state 1 or state 2, the output of the comparison is a logic 1. This corresponds to the erased state of prior art single-bit flash cells. If the selected flash cell is programmed to state 3 or state 4, the output of the comparison is a logic 0. This corresponds to the programmed state of prior art single-bit flash cells.

Figure 4:
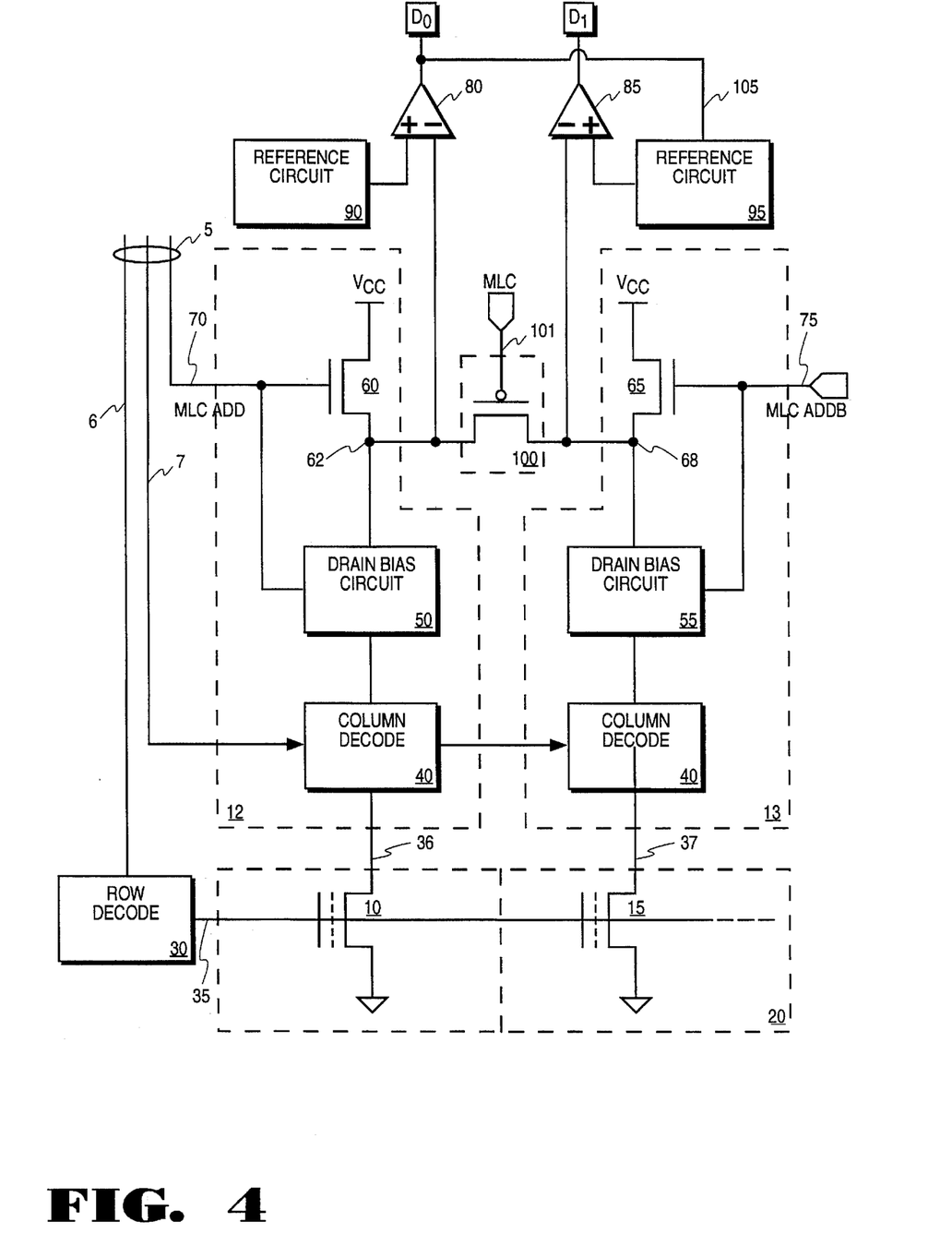
FIG. 4 illustrates a circuit for switching on the fly between single-bit and multiple-bit read modes.

FIG. 4 illustrates a circuit for switching on the fly between read modes. Shown therein are flash cells 10 and 15 which are two of the 512 k flash cells of flash array 20. Flash cell 10 is located in a data block of the flash array 20 that is coupled to output D0 via an output path during single-bit read operations. The output path for D0 includes a read path circuit 12 and a comparator 80. The read path circuit 12 includes column decode 40, drain bias circuit 50, column load 60. Flash cell 15 is located in a data block of the flash array 20 that is coupled to output D1 via an output path during single-bit read operations. The output path for D1 includes a read path circuit 13 and a comparator 85. The read path circuit 13 includes column decode 40, drain bias circuit 55, and column load 65. A read path circuit and a comparator are similarly provided between each of the remaining 14 data blocks and the corresponding output pads of the memory device. Thus, there are sixteen output paths for the sixteen output memory device.

The sixteen output paths of the memory device are divided into eight multiplexed or "muxed" pairs of output paths. The output path for output D0 and the output path for output D1 are an example of a muxed pair. Each muxed pair is provided with a switch 100 for coupling the two output paths together for a multiple-bit read operation. The switch 100 is opened and closed in response to a MLC control signal received via signal line 101. When the switch 100 is closed, one of the read path circuits of the muxed pair is disabled such that only one of the selected flash cells 10 and 15 is sensed using the multiple-bit sensing scheme described in FIGS. 3A–3B, and each of the outputs D0 and D1 output one of the two bits of data stored in the sensed flash cell. Output D0 outputs the high order bit Bit 1, and output D1 outputs the low order bit Bit 0. A signal line 105 is provided between output D0 and a reference circuit 95 so that the reference circuit 95 can select the appropriate reference flash cell in response to the initial comparison made by comparator 80. When the switch 100 is open, each read path circuit of the muxed pair is enabled and performs a single-bit read operation. Each of the selected flash cells 10 and 15 are sensed and read as if each stored only a single bit of data.

The same number of flash cells are addressed in both the single-bit and multiple-bit read modes. Addresses are received via address lines 5, which include row address lines 6, column address lines 7, and MLC address lines 70 and 75. For multiple-bit read operations, however, only half of the addressed flash cells are actually selected for reading. When the user-provided address is received via address lines 5, row decoder 30 and column decoders 40 decode the user-provided address to address sixteen flash cells of the flash array 20. Row decoder 30 selects one of 1024 wordlines, to each of which are coupled the select gates of 512 flash cells. Column decoders 40 each select from one of the thirty-two bitlines in the corresponding data blocks. Only the sixteen flash cells having select gates coupled to the selected wordline and drains coupled to the selected bitlines may be sensed. For this example, the row decoder 30 selects a wordline 35 and applies a biasing voltage $V_S$ thereto. Column decoders 40 select bitlines 36 and 37, coupling the drains of flash cells 10 and 15 to the drain bias circuits 50 and 55 of the respective read path circuits 12 and 13 for each data block.

In the illustrative flash memory device, a user-provided address is decoded to select sixteen flash cells, one flash cell per data block. For single-bit read operations all sixteen of the addressed flash cells are selected for reading. For multiple-bit read operations, only eight of the sixteen addressed flash cells are selected for reading. When in single-bit read mode, the bit of data stored in each cell is sensed and output to a corresponding output of the flash memory device via the associated output path. When in multiple-bit read mode, the data of only eight flash cells are sensed, and each cell is mapped to two outputs of the flash memory device, one bit per output. Thus, sixteen bits of data are selected for reading in both the single-bit and multiple-bit read modes. Switching between read modes is done in response to the control signal MLC.

The operation of the read path circuits and comparators will now be discussed in more detail with respect to the output path for D0. A column decode circuit 40 couples the drain of a selected flash cell 10 to drain bias circuit 50 in response to a user-provided address. The drain bias circuit 50 biases the drain of the selected flash cell 10 by coupling the drain of the selected flash cell to the column load 60. The drain bias circuit 50 along with column load 60 define a node 62 to which the negative terminal of a comparator 80 is coupled. The positive terminal of comparator 80 compares a voltage supplied by a reference circuit 90 to the voltage at node 62. The result of the comparison is output to output D0. As shown, the column load 60 is an n-channel FET coupled to operate as an active resistor when a digital logic high voltage is received at the gate of column load 60 from the MLC address line 70. The drain of column load 60 is coupled to VCC and the source of column load 60 is coupled to node 62 and the drain bias circuit 50. Alternatively, column load 60 may be a resistor or a p-channel FET.

The function of drain bias circuit 50 is to isolate the column load circuit 60 from the bitlines of the flash array 20. Between read operations, the bitlines are precharged to a predetermined maximum voltage level via the pull-up action of the column load circuit 60. The drain bias circuits 50 determine the maximum voltage level to which the bitlines are charged, decoupling the bitlines from the node 62 when the maximum voltage level is reached. Precharging the bitlines of the array provides a reservoir of charge that gives rise to a drain-source or "cell" current when a flash cell is selected for reading. This cell current, in turn, gives rise to a voltage drop across the column load circuit 60, which determines the node voltage at node 62. During multiple-bit read operations, one of the pair of read path circuits 12 and 13 has its drain bias circuit disabled such that only one flash cell is coupled to both comparators.

The cell current of the selected flash cell 10 gives rise to a drain-source current in the FET 60, which results in a voltage drop from VCC to the node 62. The voltage at node 62 is thus a function of the cell current of the selected flash cell 10. In turn, the cell current of the selected flash cell 10 is a function of the amount of charge on the floating gate of the selected flash cell 10. As $V_t$ increases, the cell current decreases. Similarly, the cell current increases as $V_t$ decreases. Thus, if the selected flash cell 10 is in state 1, the voltage at node 62 is less than if the selected flash cell 10 is in state 2.

The node 62 is coupled to the negative terminal of a comparator 80. The comparator 80 is preferably a differential sense amplifier. A reference circuit 90 is coupled to the positive terminal of comparator 80. During a single-bit per cell read operation, the function of the reference circuit 90 is to provide a voltage at the positive terminal of comparator 80 that is equivalent to the voltage at node 62 if the selected flash cell is programmed to have a $V_t$ equal to $V_{R2}$, the voltage in the separation range between the second and third states. Thus, if the $V_t$ of the selected flash cell is in either state 1 or 2, the output of comparator 80 is a logic 1 indicating that the $V_t$ of the selected flash cell 10 is less than $V_{R2}$. The selected flash cell is considered to be erased in such a case. Conversely, if the $V_t$ of the selected flash cell is in either state 3 or 4, the output of comparator 80 is a logic 0 indicating that the $V_t$ of the selected flash cell 10 is greater than $V_{R2}$. The selected flash cell 10 is considered to programmed in such a case. The coupling of the comparator 80 to the reference circuit and the selected flash cell may be reversed such that the reference circuit is coupled to the negative terminal and the selected flash cell is coupled to the positive terminal.

Figure 5:
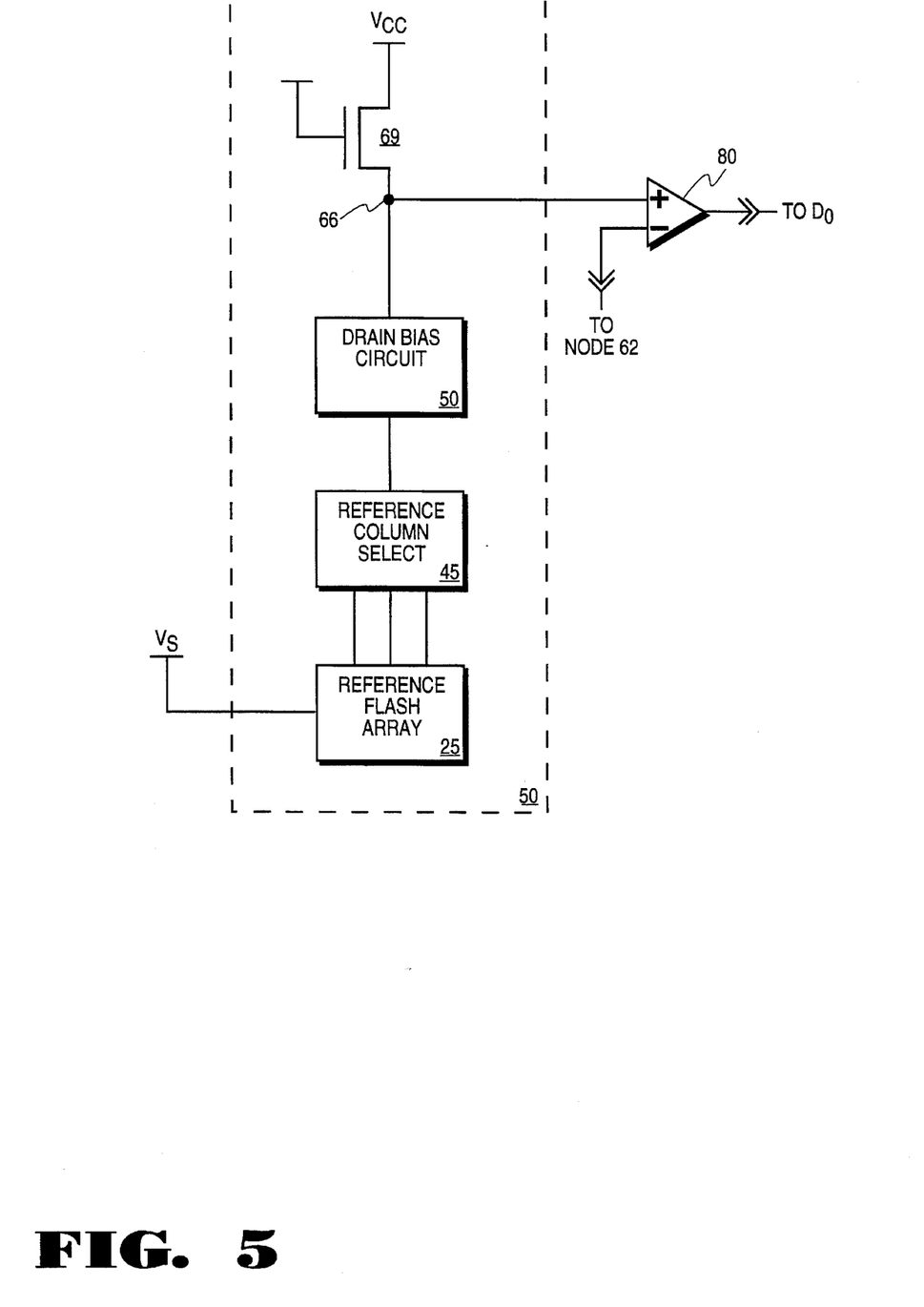
FIG. 5 shows a reference circuit according to one embodiment.

FIG. 5 shows a reference circuit according to one embodiment. The reference circuit 90 includes Ta reference flash array 25 from which reference column select 45 selects a reference flash cell to have its drain coupled to the drain bias circuit 56. Drain bias circuit 56 behaves identically to the drain bias circuits 50 and 55. The reference circuit 90 also includes a column load 69 which are preferably identical to column loads 60 and 65. The positive terminal of the comparator 80 is coupled to node 66, which is the node between the column load 69 and drain bias circuit 56. The voltage at node 66 is compared to the voltage at node 65 by the comparator 80. The reference flash cell array preferably includes at least three reference flash cells, having $V_t$ voltages equal to $V_{R1}$, $V_{R2}$, and $V_{R3}$, respectively. The number and Vt values of the reference flash cells varies with the number of analog states that the flash cell can achieve. When a reference flash cell is selected, the biasing voltage $V_S$ is applied to the select gate of the reference flash cell. The cell current of the reference cell results in a voltage at node 66. During single-bit read operations, the reference circuit 90 is preferably coupled to the reference cell having its $V_t$ equal to $V_{R2}$, and a stronger column load is provided. The selection of reference flash cells for multiple-bit read operations is discussed above.

There are a number of different ways for providing a reference voltage to sense the state of the selected flash cell. For example, one scheme is to provide two reference cells having different threshold voltages $V_t$ with their drains coupled together. Two identical column load circuits are coupled in parallel to the drains of the two reference cells at the reference node. Assuming that the same voltage is applied to the select gates of the reference cells, the voltage at the reference node is equivalent to a single reference cell having a cell current equal to the average of the cell currents of the two reference cells multiplied by the resistance of a single column load circuit. Also, the voltage reference may be generated using a single reference cell with its gate driven to one of (n−1) different values by a digital-to-analog converter.

Additionally, the current across the reference column load 466 may be produced by circuits other than reference flash cells. For example, a constant current source or current mirror may be used. The use of current mirror circuits in conjunction with an array of reference flash cells provides the needed reference currents for sensing multiple flash cells simultaneously without having to reproduce the array of reference flash cells for each output of the memory device.

The output path for output D1 includes column decode 40, drain bias circuit 55, column load 65, aM comparator 85. The comparator 85 compares a node voltage of node 68 to a voltage supplied by reference circuit 95. The n-channel FET of column load 65 is preferably identical to the FET of column load 60 and is switched on in response to a voltage received via signal line 75. Similarly labeled components for each read path circuit are preferably identical.

Returning to FIG. 4, the operation of the muxed pair of output paths will now be described with respect to a multiple-bit read operation. Switch 100 is shown as a p-channel FET having its drain coupled to node 62 and its source coupled to node 68. The switch 100 is for coupling the two output paths together during multiple-bit read operations in response to the control signal MLC received via signal line 101. The memory device enters a multiple-bit read mode when an active low MLC control signal causes switch 100 to close, coupling the output paths to each other. Simultaneously, one of the read path circuits 12 and 13 has its column load and drain bias circuit disabled in response to a signal received via signal lines 70 and 75. The state of MLC address lines 70 and 75 are determined by the MLC control signal, the MLC address signal MLC ADD, and the inverted MLC address signal MLC ADDB as shown in Table 1.

TABLE 1

| MLC | SIGNAL LINE 70 | SIGNAL LINE 75 |
|---|---|---|
| 1 | 1 | 1 |
| 0 | MLC ADD | MLC ADDB |

When the MLC control signal is inactive high, the signals provided to the gates of column loads 60 and 65 are both logic high. Both read path circuits 12 and 13 are enabled and the switch 100 is switched off. When the MLC control signal is active low, switch 100 is switched on, and nodes 62 and 68 are coupled together. Signal line 70 preferably provides the MLC address signal MLC ADD to the gate of column load 60 and to the drain bias circuit 50. Signal line 75 provides the inverted MLC address signal MLC ADDB to the gate of column load 65 and to the drain bias circuit 55 when the MLC control signal is active low. When the MLC address signal ADD is logic low, column load 60 is switched off and drain bias circuit 50 isolates the node 62 from the selected flash cell 10. Similarly, when the inverted MLC address signal ADDB is logic low, column load 65 is switched off and drain bias circuit 55 isolates the node 68 from the selected flash cell 15. Thus, only one of the two selected flash cells is coupled to nodes 62 and 68. The state of the flash cell is sensed by both comparators 80 and 85, which each output one of the two bits of data stored in the flash cell.

Figure 6:
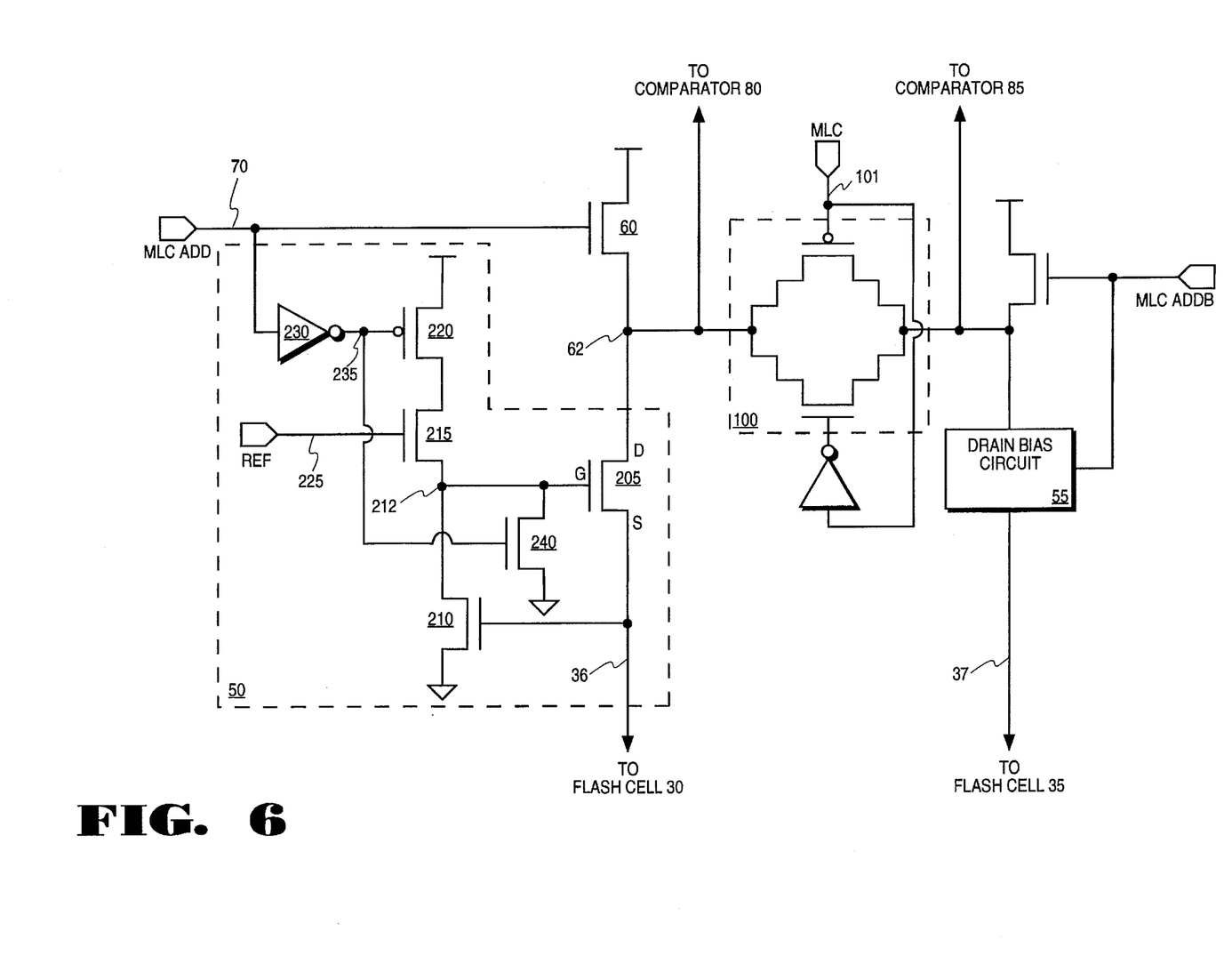
FIG. 6 shows a drain bias circuit according to one embodiment.

FIG. 6 illustrates the drain bias circuit 50 in greater detail. The switch 100 is shown as a complementary switch. The drain bias circuit 50 includes an n-channel FET 205 coupled as a cascode device. FET 205 has its source coupled to the drain of the selected flash cell 10 via bit line 36 and its drain coupled to the source of column load 60 and the negative terminal of comparator 80 at node 62. The FET 205 couples and decouples node 62 to bitline 36 in response to its gate-source voltage, which is determined by the bitline 36 and by n-channel FETs 210, 215 and 240 and p-channel FET 220. FETs 210 and 215 act as an inverter that determines the maximum voltage to which the bitline 36 can rise during precharging. FET 210 has its gate coupled to the bitline, its source coupled to ground and its drain coupled to the gate of FET 205. As the voltage of bitline 36 increases, the FET 210 switches on, pulling the gate voltage of FET 205 down towards ground.

During a read operation, FETs 210 and 215 act as an inverter that sets the gate voltage of FET 205. When the biasing voltage $V_S$ is applied to the gate of the selected flash cell 10, the precharged bitline 36 is coupled to ground, giving rise to a cell current. As the bitline 36 discharges towards ground, the gate voltage of the FET 205 increases, increasing the current that flows through FET 205. The voltage drop across the column load 60 increases correspondingly. In this manner, the FET 205 makes the drain voltage independent of the voltage at the source of the column load 60. The state to which the selected flash cell 10 is programmed thus ultimately determines the voltage at node 62.

FET 220 enables the drain bias circuit 50. FET 220 has its gate coupled to the inverter 230, its drain coupled to VCC, and its source coupled to the drain of FET 215. FET 215 has its source coupled to the drain of FET 210 and its gate coupled to a reference voltage REF, which determines the maximum voltage to which the gate of FET 205 can rise. The reference voltage REF is selected such that FET 215 acts as a resistor, limiting the maximum voltage supplied to the gate of FET 205.

FET 240 disables the drain bias circuit 50. FET 240 is provided to pull the gate of FET 205 to ground when signal line 70 is at a logic low voltage level. FET 240 has its drain coupled to the gate of FET 205, its source coupled to ground, and its gate coupled to signal line 235 to receive the inverted value of signal line 70 via the inverter 230. During single-bit operations, FET 240 is switched off because signal line 70 is always at a logic high voltage. During multiple-bit operations, FET 240 is switched on if MI address signal ADD is logic low. Switching the FET 240 on causes the FET 205 to switch off, decoupling node 62 from the selected flash cell 10. The column load 60 is also switched off when MLC ADD is logic low.

Figure 7:
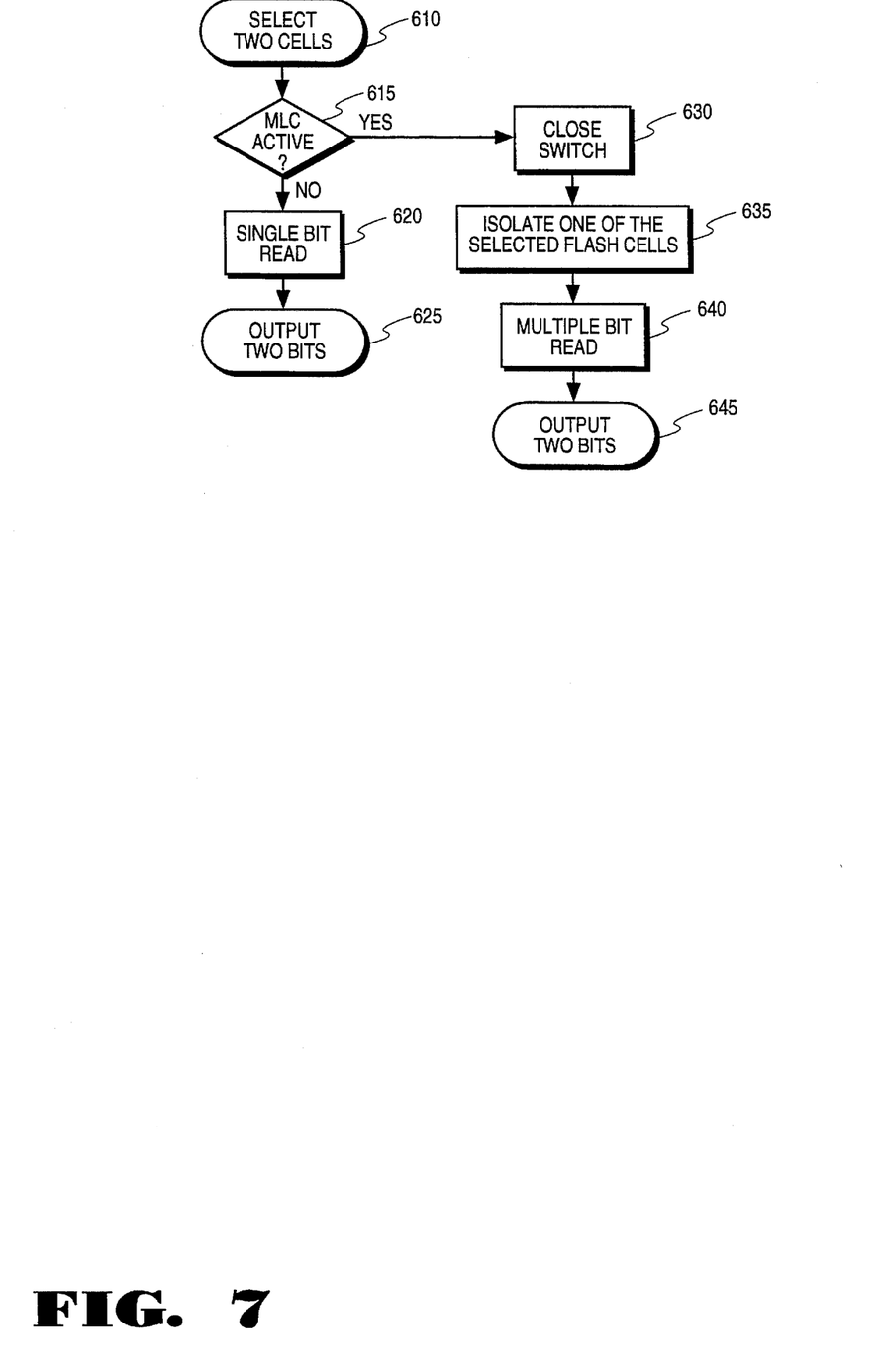
FIG. 7 is a flow chart illustrating the method for switching between single-bit and multiple-bit read modes.

FIG. 7 is a flow chart illustrating the method of switching between single-bit and multiple-bit read modes. At step 610, two flash cells are selected in response to a user-provided address. One flash cell is selected for each of a muxed pair of output paths. At step 615, it is determined whether the MLC control signal is active, which indicates that a multiple-bit read operation is to be performed. The MLC control signal may be active high or active low, but has been described as being an active low signal in the continuing example above. If MLC control signal is inactive, which in this embodiment is logic high, two single-bit read operations are performed in parallel by each of the muxed pair of output paths at step 620. Two binary bits, each indicating the state of a corresponding flash cell, are output at step 625.

If the MLC control signal is active at step 615, which in this embodiment is logic low, the switch is closed at step 630, connecting the muxed pair of output paths to each other. The MLC address signals MLC ADD and MLC ADDB are enabled by the MLC control signal being active such that one of the two selected flash cells is isolated from the comparator of its output path at step 635. As described above, isolation is achieved by disabling the column load and drain bias circuit of one of the read path circuits. At step 640, a binary search multiple-bit read operation of the non-isolated selected flash cell is then performed using the comparators and reference circuits of both output paths. Two binary bits, both indicating the state of the non-isolated selected flash cell, are output at step 645.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A memory device comprising:

a first memory cell;

a first comparator including a first terminal and a second terminal;

a first read path circuit coupled between the first memory cell and the first terminal of the first comparator;

a second memory cell;

a second comparator including a first terminal and a second terminal;

a second read path circuit coupled between the second memory cell and the first terminal of the second comparator;

a switching circuit coupled to the first terminals of the first and second comparators and coupled to receive a control signal, the switching circuit for coupling the first terminal of the first comparator to the first terminal of the second comparator and for disabling the second read path circuit when the control signal is active such that the first terminals of the first and second comparators are both coupled to the first read path circuit.

2. The memory device of claim 1, wherein the memory device further comprises:

a first reference circuit coupled to the second terminal of the first comparator for generating a first reference voltage; and a second reference circuit coupled to the second terminal of the second comparator for generating a second reference voltage.

3. The memory device of claim 2, wherein the second read path circuit includes:

a drain bias circuit coupled to the second memory cell;

a column load circuit coupled to the drain bias circuit, wherein the first terminal of the second comparator is coupled to a node defined between the column load circuit and the drain bias circuit.

4. The memory device of claim 3, wherein the drain bias circuit includes:

a first field effect transistor (FET) having a drain coupled to the column load circuit and a source coupled to the second memory cell, wherein the first FET is disabled in response to the active control signal.

5. The memory device of claim 4, wherein the column load circuit comprises:

a second FET coupled as a resistor between a supply voltage and the drain of the first FET when the control signal is inactive, wherein the second FET is disabled when the control signal is active.

6. The memory device of claim 5, wherein the second memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node when the control signal is inactive such that the second comparator compares the node voltage to the second reference voltage and outputs a result.

7. The memory device of claim 2, wherein the first read path circuit includes:

a drain bias circuit coupled to the first memory cell;

a column load circuit coupled to the drain bias circuit, wherein the first terminal of the first comparator is coupled to a node defined between the column load circuit and the drain bias circuit.

8. The memory device of claim 7, wherein the drain bias circuit includes:

a first field effect transistor (FET) having a drain coupled to the column load circuit and a source coupled to the first memory cell, wherein the first FET is enabled when the control signal is active.

9. The memory device of claim 8, wherein the column load circuit comprises:

a second FET coupled as a resistor between a supply voltage and the drain of the first FET, wherein the second FET is enabled when the control signal is active.

10. The memory device of claim 9, wherein the first memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node, the first comparator for comparing the node voltage to the first reference voltage, the second comparator for comparing the node voltage to the second reference voltage when the control signal is active.

11. The memory device of claim 10, wherein the second reference circuit is coupled to an output of the first comparator, the second reference circuit for generating the second reference voltage in response to the output of the first comparator.

12. The memory device of claim 10, wherein the first amount of charge corresponds to one of m possible states, where m is greater than 2.

13. The memory device of claim 10, wherein the first and second comparators perform a binary search read operation when the control signal is active.

14. A memory device comprising:

a first memory cell;

a first comparator including a first positive terminal and a first negative terminal;

a first read path circuit coupled between the first memory cell and the first negative terminal;

a second memory cell;

a second comparator including a second positive terminal and a second negative terminal;

a second read path circuit coupled between the second memory cell and the second negative terminal;

a switching circuit coupled to the first and second negative terminals and coupled to receive a control signal, the switching circuit for coupling the first negative terminal to the second negative terminal and for disabling the second read path circuit when the control signal is active such that the first and second negative terminals are both coupled to the first read path circuit.

15. The memory device of claim 14, wherein the memory device further comprises:

a first reference circuit coupled to the first positive terminal for generating a first reference voltage; and a second reference circuit coupled to the second positive terminal for generating a second reference voltage.

16. The memory device of claim 15, wherein the second read path circuit includes:

a drain bias circuit coupled to the second memory cell;

a column load circuit coupled to the drain bias circuit, wherein the second negative terminal is coupled to a node defined between the column load circuit and the drain bias circuit.

17. The memory device of claim 16, wherein the drain bias circuit includes:

a first field effect transistor (FET) having a drain coupled to the column load circuit and a source coupled to the second memory cell, wherein the first FET is disabled in response to the active control signal.

18. The memory device of claim 17, wherein the column load circuit comprises:

a second FET coupled as a resistor between a supply voltage and the drain of the first FET when the control signal is inactive, wherein the second FET is disabled when the control signal is active.

19. The memory device of claim 18, wherein the second memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node when the control signal is inactive such that the second comparator compares the node voltage to the second reference voltage and outputs a result.

20. The memory device of claim 15, wherein the first read path circuit includes:

a drain bias circuit coupled to the first memory cell;

a column load circuit coupled to the drain bias circuit, wherein the first negative terminal is coupled to a node defined between the column load circuit and the drain bias circuit.

21. the memory device of claim 20, wherein the drain bias circuit includes:

a first field effect transistor (FET) having a drain coupled to the column load circuit and a source coupled to the first memory cell, wherien the first FET is enabled when the control signal is active.

22. The memory device of claim 21, wherein the column load circuit comprises:

a second FET coupled as a resistor between a supply voltage and the drain of the first FET, wherein the second FET is enabled when the control signal is active.

23. The memory device of claim 22, wherein the first memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node, the first comparator for comparing the node voltage to the first reference voltage, the second comparator for comparing the node voltage to the second reference voltage when the control signal is active.

24. The memory device of claim 23, wherein the second reference circuit is coupled to an output of the first comparator, the second reference circuit for generating the second reference voltage in response to the output of the first comparator.

25. The memory device of claim 23, wherein the first amount of charge corresponds to one of m possible states, where m is greater than 2.

26. The memory device of claim 23, wherein the first and second comparators perform a binary search read operation when the control signal is active.

27. A computer system comprising:

a processor; and a memory device coupled to the processor, the memory device comprising:

a first memory cell;

a first comparator including a first terminal and a second terminal;

a first read path circuit coupled between the first memory cell and the first terminal of the first comparator;

a second memory cell;

a second comparator including a first terminal and a second terminal;

a second read path circuit coupled between the second memory cell and the first terminal of the second comparator;

a switching circuit coupled to the first terminals of the first and second comparators and coupled to receive a control signal, the switching circuit for coupling the first terminal of the first comparator to the first terminal of the second comparator and for disabling the second read path circuit when the control signal is active such that the first terminals of the first and second comparators are both coupled to the first read path circuit.

28. The computer system of claim 27, wherein the memory device further comprises:

a first reference circuit coupled to the second terminal of the first comparator for generating a first reference voltage; and a second reference circuit coupled to the second terminal of the second comparator for generating a second reference voltage.

29. The computer system of claim 28, wherein the second read path circuit includes:

a drain bias circuit coupled to the second memory cell;

a column load circuit coupled to the drain bias circuit, wherein the first terminal of the second comparator is coupled to a node defined between the column load circuit and the drain bias circuit.

30. The computer system of claim 29, wherein the drain bias circuit includes:

a first field effect transistor (FET) having a drain coupled to the column load circuit and a source coupled to the second memory cell, wherein the first FET is disabled in response to the active control signal.

31. The computer system of claim 30, wherein the column load circuit comprises:

a second FET coupled as a resistor between a supply voltage and the drain of the first FET when the control signal is inactive, wherein the second FET is disabled when the control signal is active.

32. The computer system of claim 31, wherein the second memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node when the control signal is inactive such that the second comparator compares the node voltage to the second reference voltage and outputs a result.

33. The computer system of claim 28, wherein the first read path circuit includes:

a drain bias circuit coupled to the first memory cell;

a column load circuit coupled to the drain bias circuit, wherein the first terminal of the first comparator is coupled to a node defined between the column load circuit and the drain bias circuit.

34. The computer system of claim 33, wherein the drain bias circuit includes:

a first field effect transistor (FET) having a drain coupled to the column load circuit and a source coupled to the first memory cell, wherein the first FET is enabled wehn the control signal is active.

35. The computer system of claim 34, wherein the column load circuit comprises:

a second FET coupled as a resistor between a supply voltage and the drain of the first FET, wherein the second FET is enabled when the control signal is active.

36. The computer system of claim 35, wherein the first memory cell comprises:

a third FET having a select gate coupled to a biasing voltage, a floating gate for storing a first amount of charge, a source coupled to system ground, and a drain coupled to the drain bias circuit, wherein the first amount of charge determines a node voltage at the node, the first comparator for comparing the node voltage to the first reference voltage, the second comparator for comparing the node voltage to the second reference voltage when the control signal is active.

37. The computer system of claim 36, wherein the second reference circuit is coupled to an output of the first comparator, the second reference circuit for generating the second reference voltage in response to the output of the first comparator.

38. The computer system of claim 36, wherein the first amount of charge corresponds to one of m possible states, where m is greater than 2.

39. The computer system of claim 36, wherein the first and second comparators perform a binary search read operation when the control signal is active.

40. The computer system of claim 27, wherein the computer system further includes a solid state hard drive which includes the memory device.

41. The computer system of claim 27, wherein the computer system further includes a memory card which includes the memory device.

42. In a memory device, a method for switching between a single-bit read mode and a multiple-bit read mode, the method comprising the steps of:

selecting a first memory cell and a second memory cell;

generating a control signal;

if the control signal is inactive:

sensing a first cell voltage of the first memory cell using a first read path circuit;

comparing the first cell voltage to a first reference voltage using a first comparator coupled to the first read path circuit;

outputting a first result of comparing the first cell voltage to the first reference voltage;

sensing a second cell voltage of the second memory cell using a second read path circuit;

comparing the second cell voltage to a second reference voltage using a second comparator coupled to the second read path circuit; and outputting a second result of comparing the second cell voltage to the second reference voltage if the control signal is active:

disabling the second read path circuit;

coupling the second comparator to the first read path circuit;

comparing the first cell voltage to the first reference voltage using the first comparator;

outputting a first result;

selecting a third reference voltage in response to the first result;

comparing the first cell voltage to the third reference voltage using the second comparator;

outputting a third result of comparing the first cell voltage to the third reference voltage.

43. A memory device comprising:

a first memory cell;

a first sense amplifier coupled to sense a state of the first memory cell;

a second memory cell;

a second sense amplifier coupled to sense a state of the second memory cell; and a switching circuit coupled to the first and second sense amplifiers and coupled to receive a control signal, the switching circuit for coupling the first memory cell to the second sense amplifier and decoupling the second memory cell from the second sense amplifier when the control signal is active such that the first and second sense amplifiers are both coupled to sense the state of the first memory cell.

* * * * *

UNITED STATES PATENT AND TRADEMARK OFFICE
CERTIFICATE OF CORRECTION

PATENT NO. : 5,485,422
DATED : January 16, 1996
INVENTOR(S) : Bauer et al.

It is certified that error appears in the above-indentified patent and that said Letters Patent is hereby corrected as shown below:

In column 4 at line 32 delete "hat" and insert --that--

In column 8 at line 33 delete "Ta" and insert --a--

In column 9 at line 13 delete "aM" and insert --and--.

In column 10 at line 44 delete "MI" and insert --MLC--

In column 13 at line 53 delete "wherien" and insert --wherein--

In column 15 at line 23 delete "wehn" and insert --when--

Signed and Sealed this

Nineteenth Day of August, 1997

Attest:

BRUCE LEHMAN

Attesting Officer

Commissioner of Patents and Trademarks